United States Patent [19]
Daane

[11] Patent Number: 6,017,244
[45] Date of Patent: Jan. 25, 2000

[54] INTERCONNECTION MECHANISM FOR FLEXIBLE PRINTED CIRCUITS

[75] Inventor: Laurence Alan Daane, Sherwood, Oreg.

[73] Assignee: The Whitaker Corporation, Wilmington, Del.

[21] Appl. No.: 09/020,796

[22] Filed: Feb. 9, 1998

[51] Int. Cl.[7] .................................................. H01R 9/07
[52] U.S. Cl. ............................ 439/495; 439/67; 439/77
[58] Field of Search .................................. 439/55, 65, 67, 439/69, 190, 197, 492–499, 592–3, 629, 632; 174/35 GC, 117 FF, 117 F

[56] References Cited

U.S. PATENT DOCUMENTS

| | | | |
|---|---|---|---|
| 4,850,883 | 7/1989 | Kabadi | 439/67 |
| 5,160,269 | 11/1992 | Fox, Jr. et al. | 439/67 |
| 5,263,868 | 11/1993 | Renn et al. | 439/67 |

*Primary Examiner*—Lincoln Donovan
*Attorney, Agent, or Firm*—Gerald K. Kita

[57] ABSTRACT

An interconnection mechanism (1) for electrically connecting circuit paths (2) on respective flexible printed circuits (3) has clamping jaws (4, 5) to clamp a stack (6) of overlapped flexible printed circuits (3) that are in fixed registration on said mechanism (1), the clamping jaws (4, 5) having directly opposed, raised surfaces (14, 15) forcing said circuit paths (2) between the surfaces (14, 15) to engage at multiple spaced locations.

4 Claims, 5 Drawing Sheets

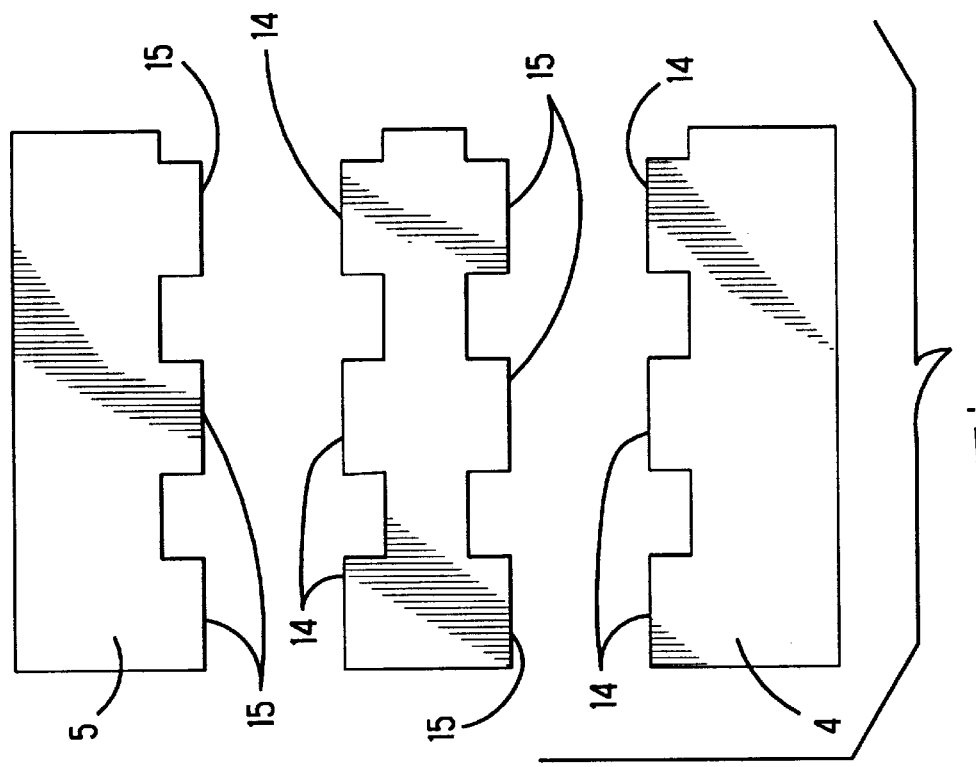
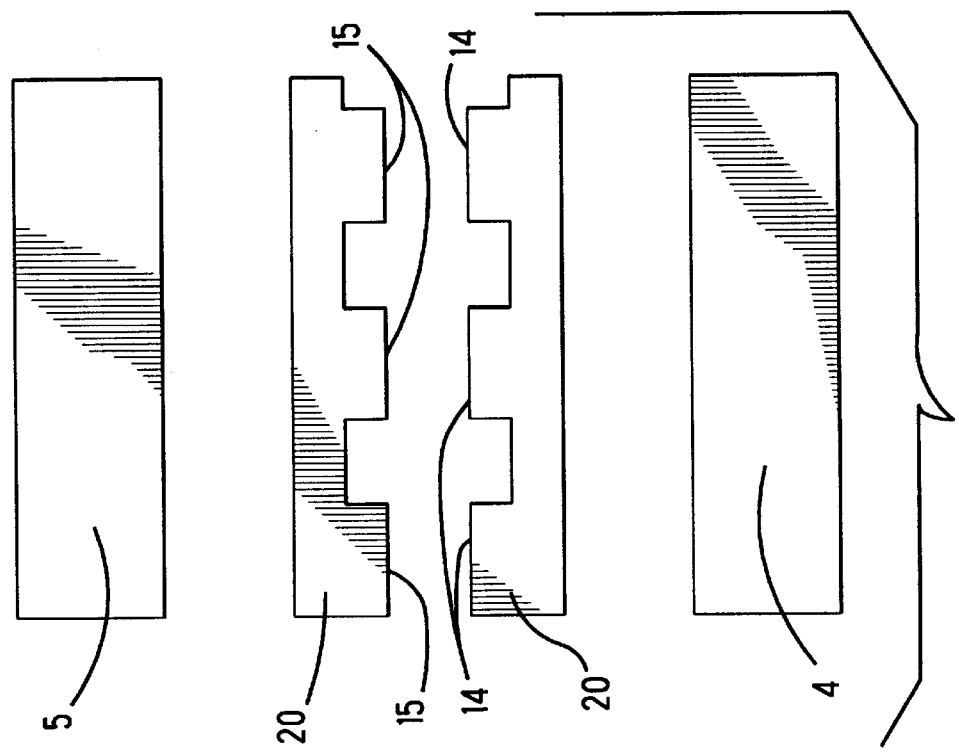

6,017,244

INTERCONNECTION MECHANISM FOR FLEXIBLE PRINTED CIRCUITS

FIELD OF THE INVENTION

The invention relates to interconnection of flexible printed circuits, and, more particularly, to an interconnection mechanism to connect circuit pads on one or more layers of flexible printed circuits to one another.

BACKGROUND OF THE INVENTION

A flexible printed circuit has an array of conducting, printed circuit paths on a strip of flexible insulating material. For example, the circuit paths connect by solder joints to respective, slender, insulated, signal transmitting wires that are on the order of, 38 American Wire Gauge and smaller gauges. The printed circuit paths are said to terminate the signal transmitting wires. The printed circuit paths extend from respective said wires to extend side by side in a compact, printed array on the flexible insulating material. The flexible printed circuit maintains the printed circuit pads precisely centered along compact, pitch spacings, which facilitates their electrical connection to another array of compact, circuit paths provided, for example, by a printed circuit.

For example, U.S. Pat. No. 5,160,269, describes that printed circuit paths on a flexible circuit become electrically connected by the application of hydraulic pressure exerted against the flexible printed circuit to promote desirable, high contact pressure on each of the circuit pads. Although contact pressure at the electrical connection is established by the applied hydraulic pressure, skilled assembly is required, and preveinting leakage of the hydraulic fluid is required to avoid a failure mode.

SUMMARY OF THE INVENTION

The invention relates to a termination mechanism to connect circuit paths on respective flexible printed circuits. The mechanism comprises clamping jaws to clamp a stack of overlapped flexible printed circuits. At least one pair of flexible printed circuits is overlapped with the circuit paths on one of the pair being overlapped with respective circuit paths on another of the pair. The termination mechanism is provided for electrically connecting respective circuit paths on one of the pair of flexible printed circuits with respective circuit paths on another of the pair.

Multiple pairs of flexible printed circuits are stacked, one the other, with each pair of flexible printed circuits having overlapped respective circuit paths. The termination mechanism is provided for electrically connecting overlapped respective circuit paths on respective flexible circuits.

Embodiments of the invention will now be described by way of example with reference to the accompanying drawings, according to which:

DESCRIPTION OF THE DRAWINGS

FIG. 9 is an end view of raised surfaces on a component part to be against each of the clamping jaws; and FIG. 10 is an end view of raised surfaces on a component part to be between pairs of flexible printed circuits.

DETAILED DESCRIPTION

Figure 1:
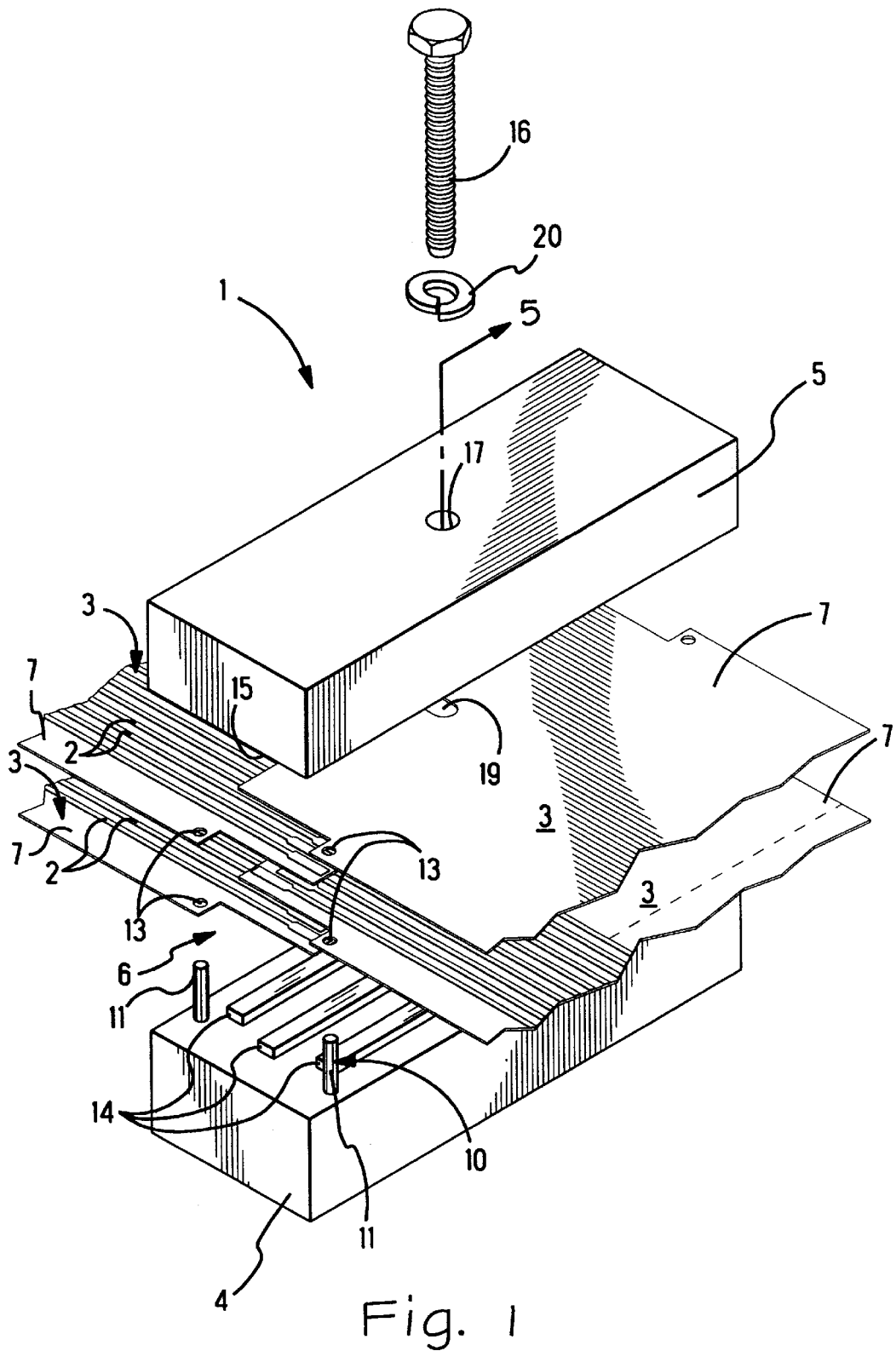
FIG. 1 is an enlarged isometric view of a termination mechanism and multiple pairs of flexible printed circuits that are deformed by closure of clamping jaws, shown with parts separated from one another.

With reference to FIG. 1, the invention relates to a termination mechanism 1 to connect circuit paths 2 on respective flexible printed circuits 3, and more particularly, at least one pair of flexible printed circuits 3. The mechanism 1 comprises clamping jaws 4, 5 to clamp a stack 6 of overlapped flexible printed circuits 3.

Figure 3:
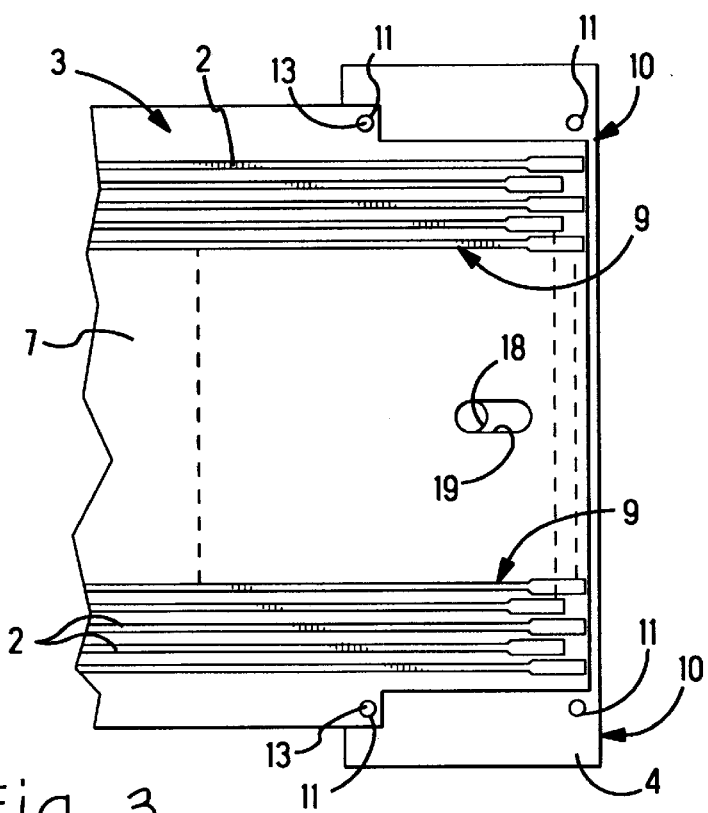
FIG. 3 is a top view of one of the clamping jaws and one of the flexible printed circuits in fixed registration on said one of the clamping jaws.

Each of the flexible printed circuits 3 comprises a sheet of flexible insulating material 7 for example, fabricated of Kapton, a registered trademark of E. I DuPont deNemours & Co., on which is deposited on one side, conducting printed circuit paths 2 arranged in a patterned array 9. For example, the flexible insulating material 7 can be on the order of 2.5 mils thick. With reference to FIG. 3, at this thickness the flexible insulating material 7 has a permanent set to extend substantially flat in a plane horizontal to the pull of gravity. For example, the printed circuit paths 2 are flexible when the flexible insulating material 7 undergoes flexure, in response to applied force, for example, when the jaws 4, 5 close together. Once the force is withdrawn the flexible insulating material 7 will tend to return resiliently to its configuration having a permanent set.

The termination mechanism 1 is provided for electrically connecting overlapped respective circuit paths 2 on respective flexible printed circuits 7.

Figure 4:
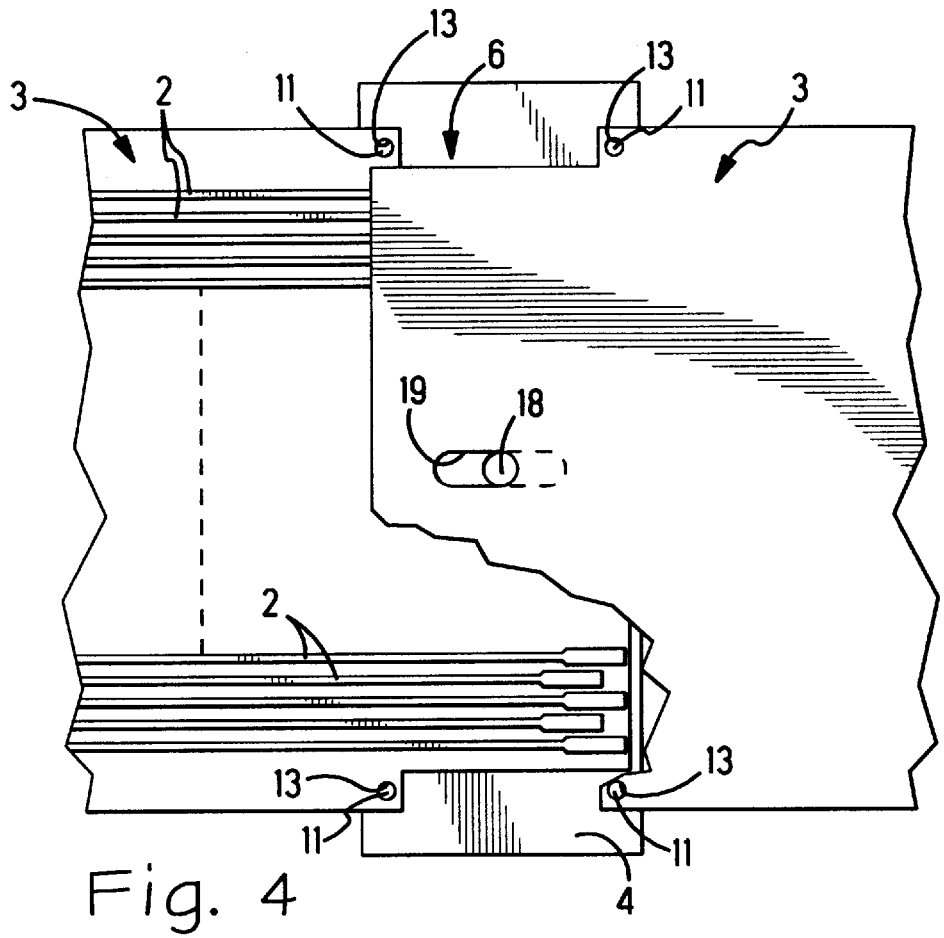
FIG. 4 is a view similar to FIG. 3 shown at least one pair of flexible printed circuits with their respective circuit paths overlapping, and shown partially broken away.

With reference to FIG. 4, at least one pair of flexible printed circuits 3 is overlapped with the circuit paths 2 on one of the flexible printed circuits 3 of the pair being overlapped with respective circuit paths 2 on another of the flexible printed circuits 3 of the pair. The termination mechanism 1 is provided for electrically connecting respective circuit paths 2 on one of the flexible printed circuits 3 of the pair with respective circuit paths 2 on another of the flexible printed circuits 3 of the pair. Multiple pairs of flexible printed circuits 3 are in a stack 6, FIG. 1, and are stacked, one the other, with each pair of flexible printed circuits 3 having overlapped respective circuit paths 2.

Connection of one pair to another pair is also desirable, when additional circuit paths are provided on back sides of respective, flexible printed circuits 3. Such additional circuit paths can be ground planes, for example. When corresponding pairs of the flexible printed circuits are stacked, the ground plane on a back side on one pair will engage the ground plane on a back side on another pair. Clamping the pairs together will electrically common the ground planes, as well as, electrically connect the circuit paths 2 on front sides of the flexible printed circuits 3. The flexible printed circuits 3 can be constructed with the circuit paths 2 on the back sides, as well as the front sides, in which case the printer circuits on the back sides are overlapped in the stack, and are connected with one another by clamping the pairs together.

With reference to FIGS. 1 and 3, the termination mechanism 1 further comprises, a registration portion 10 on at least one of said clamping jaws 4, 5 to retain a first portion of each said flexible printed circuits 3 in fixed registration on said registration portion 10. For example, the registration portion 10 comprises a set of multiple spaced apart pins 11. The clamping jaw 4, 5 opposite said pins 11 has receiving recesses 12, FIG. 2, that provide clearance to receive the pins 11 when the clamping jaws 4, 5 close toward one another. The registration portion 10 can be on solely one of the jaws 4, 5 by placing each set of the registration pins 10 on one of the jaws 4, 5. The sets can be apportioned among the clamping jaws 4, 5, such that the registration portion 10 is on both of the jaws 4, 5. Thus, the registration portion 10 is on at least one of the jaws 4, 5.

The flexible printed circuits 3 have registration holes 13 through the flexible insulating material 7 that align with and receive a corresponding set of pins 11 of a registration portion 10. For example, the flexible printed circuits 3 are cut away to avoid registration with any additional set of pins 11. In some circumstances, the flexible printed circuits 3 align with and receive a second set of registration holes 13 to align with and receive a corresponding set of pins 11 of another one of multiple registration portions 10. Accordingly, each pair of printed circuits 3 are in fixed registration with the clamping jaws 4, 5. The pairs are in a stack 6, for example.

The clamping jaws 4, 5 have clamping surfaces 14, 15 to apply clamping forces on said stack 6, and said clamping jaws 4, 5 being clamped together, forcing both of said flexible printed circuits 3 of each corresponding pair to undergo resilient deformation. The clamping surfaces 14, 15 concentrate clamping forces against said flexible printed circuits 3. The clamping surfaces 14, 15 on the corresponding jaws 4, 5 aligns with said circuit paths 2, and more particularly, extends transversely across the circuit paths 2 of each array 9.

With reference to FIG. 1, a fastener 16 urges said clamping jaws 4, 5 to clamp said stack 6. Said fastener 16 extends through a bore 17 through one of the jaws 4, 5, and extends threadably and adjustably along an internally threaded recess 18, FIG. 5, in another one of the jaws 4, 5. Advancing the fastener 16 threadably will close the jaws 4, 5 and apply force on each of the flexible printed circuits 3 in the stack 6, deforming each resiliently while in its respective flat plane, while being in fixed registration with at least one of the jaws 4, 5, and while being in contact with the clamping surfaces 14, 15 on the jaws 4, 5. Said fastener 16 passes through slotted openings 19, FIGS. 3 and 4, through said flexible printed circuits 3. A resiliently deformable spring 20, FIG. 1, in the form of a split washer is clamped between an enlarged head on the fastener 16 and one of the clamping jaws 4, 5. The spring 20 is resiliently compliant to expand and contract with temperature and vibration, so as to apply continuously uniform force on the clamping jaws 4, 5. In turn, uniform clamping force is applied to the stack of flexible printed circuits 3 to maintain them in pressure contact with one another. According to another embodiment, a compressible element is situated between the clamping jaws to maintain residual clamping pressure.

Figure 2:
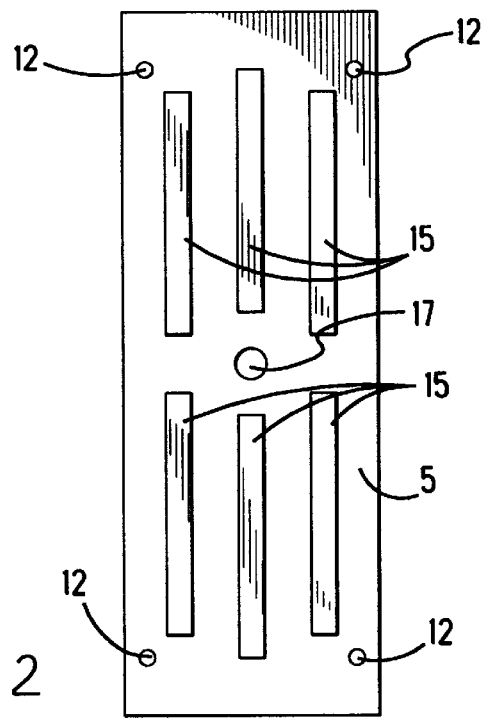
FIG. 2 is a bottom view of one of the clamping jaws of the mechanism as shown in FIG. 1.

With reference to FIG. 2, the clamping surfaces 15 are comprised of a series of raised clamping surfaces 15 spaced apart on corresponding pedestals projecting outward of the corresponding jaw 5. Each of the raised clamping surfaces 15 is divided into two segments. With reference to FIG. 2, for example, the jaw 5 is rectangular and measures 0.600 inches on an end and 1.050 inches on a side. The clamping surfaces 15 are each about 0.057 inches wide (one being 0.056 inches wide, and another being 0.060 inches wide), and about 0.030 inches high.

Figure 5:
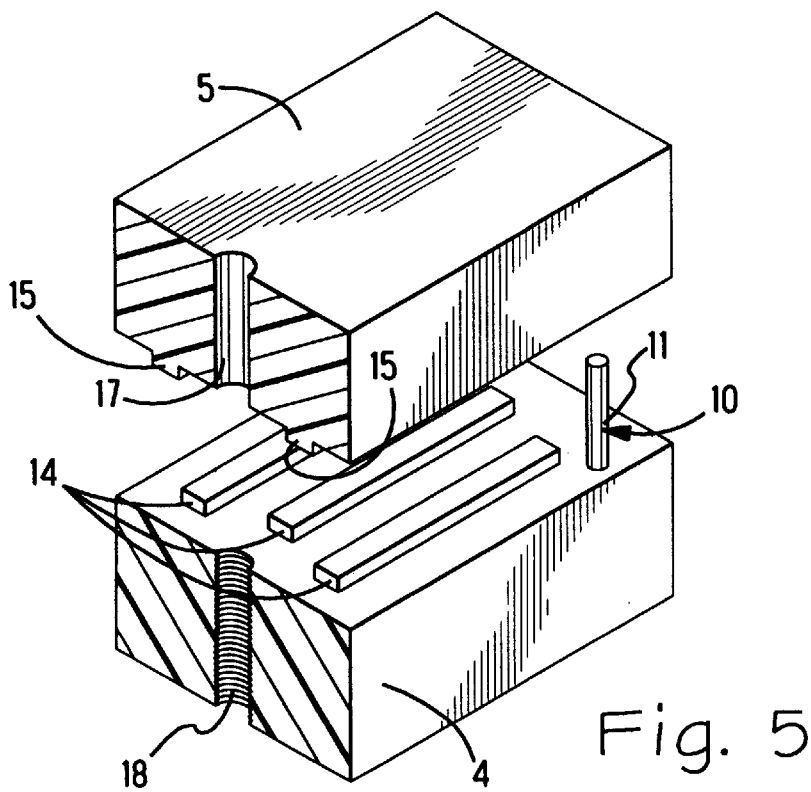
FIG. 5 is an isometric view of the clamping jaws of the mechanism as shown in FIG. 1 with parts separated and with parts broken away.
Figure 8:
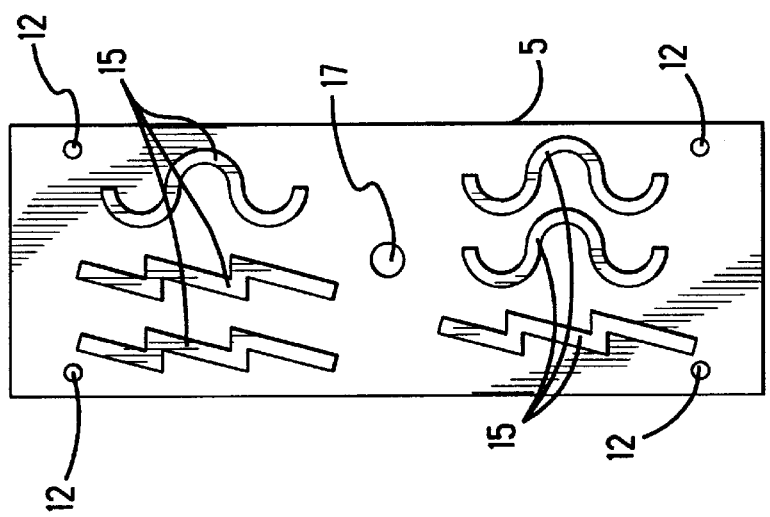
FIG. 8 is a top view of one of the clamping jaws having raised surfaces of an alternate configuration.
Figure 7:
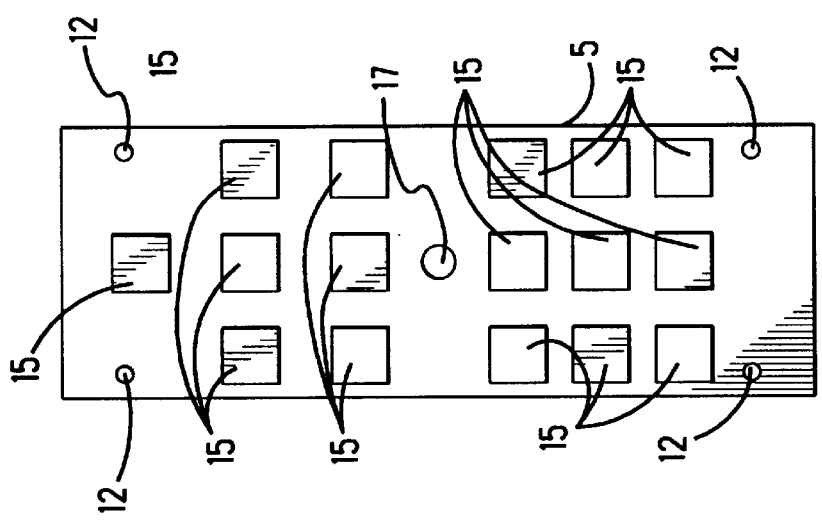
FIG. 7 is a top view of one of the clamping jaws having raised surfaces of an alternate configuration.
Figure 6:
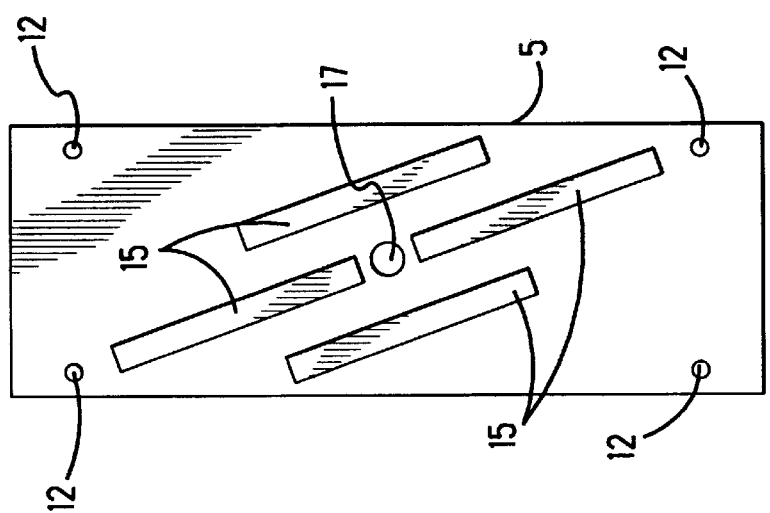
FIG. 6 is a top view of one of the clamping jaws having raised surfaces of an alternate configuration.

As shown in FIGS. 2 and 5, the clamping surfaces 15 are straight and extend in directions transversely or orthogonally across the circuit paths 2 on each corresponding pair of flexible printed circuits 3. As shown in FIG. 6 the clamping surfaces 15 are straight and extend in directions diagonally across the circuit paths 2 on each corresponding pair of flexible printed circuits 2. As shown in FIG. 6, the clamping surfaces 15 extend in directions diagonally across the circuit paths 2 on each corresponding pair of flexible printed circuits 2. As shown in FIG. 7, each of the clamping surfaces 15 is segmented, by being divided into multiple segments. As shown in FIG. 8, the clamping surfaces extend in repeatedly reverse directions, either sharply reversing, as shown by a zig-zag shapes, or curving reversely, as shown by approximately sinusoidal shapes.

A similar series of raised clamping surfaces 14 are on the jaw 4, FIG. 5. Alternatively, the jaw 4 has a single flat clamping surface 14, FIG. 9. The clamping surfaces 14, 15 are directly opposed when between the jaws 4, 5. The directly opposed clamping surfaces 14, 15 have the same shapes. The directly opposed clamping surfaces 14, 15 are unitary with respective jaws 4, 5, or, as shown in FIGS. 9 and 10, are provided on a corresponding component part 21 that is inserted between the jaws 4, 5. In FIG. 9, the clamping surfaces 14 are on a first corresponding component part 21, and the clamping surfaces 15 are on a second corresponding component part 21. The first and second component parts 20 are between and against the jaws 4, 5 with the clamping surfaces 14, 15 directly opposed. In FIG. 10, the same component part 21 has clamping surfaces 14 on one side, and clamping surfaces 15 on an opposite side, which directly oppose respective jaws 4, 5 having corresponding clamping surfaces 15, 14. The component part 21 of FIG. 10 is adapted to be between the jaws 4, 5, and also is adapted to be between two pairs of flexible printed circuits 7, to apply clamping pressure directly against back sides of respective, flexible printed circuits 3.

Testing was conducted to determine whether 1680 connections of flexible printed circuits can be made on 42 pairs of such circuits, using mechanical clamping pressure. The 0.006 inches wide, circuit paths 2 are on 0.012 inches pitch spacing in the contact zone. The circuit paths 2 are each 0.001 inches thick rolled Cu with 50 micro-inches of Ni plating followed by 50 micro-inches of Au overplating. Three clamp designs were tested. Design #1 is a flat plate jaw 5 mating to a flat bottom jaw 4. Design #2 is a ribbed plate jaw 5 with a set of three projecting surfaces 15 extending perpendicular across the circuit paths 2, mating to a flat jaw 4. Design #3 is a checkerboard pattern of projecting surfaces 15, mating to a flat jaw 4. Design #1 produced continuity of 100% of the 1680 contacts of the circuit paths 2 at 6 inch-ounces of torque applied to a center screw 16. Design #2 achieved 100% contact at 3 inch-ounces of torque, which is ½ of the torque required for Design #1. All 1680 contacts circuits had electrical continuity with the application of 3 inch ounces of torque to the central screw 16. This is equivalent to 86 grams of force based on a friction coefficient $\mu=0.74$. Design #3 achieved 100% contact at 14 inch-ounces, almost five times the torque need for Design #2. Although an explanation of how the mechanism 1 operates is uncorroborated at this time, it is beleved that the flexible printed circuits 3, while being straight planar, also have very small local areas of varied thicknesses, and also have very small local warped areas that diverge from a straight line planar axis. When a pair of flexible printed circuits 3 overlap, the overlapping circuit paths 2 physically engage only among some of these very small local areas. The multiple clamping surfaces 14, 15 distribute a clamping force among multiple locations along each of the circuit paths 2, which distributes the clamping force among many, very small local areas, some of which local areas coincide with the very small local areas of physical contact between the opposed circuit paths 2 to apply sufficient forces over the areas to establish electrical connections of the overlapped circuit paths 2.

Although preferred embodiments of the invention are described, other embodiments and modifications of the invention are intended to be covered by the spirit and scope of the appended claims.

What is claimed is:

1. An interconnection mechanism for connecting circuit paths on one flexible printed circuit to overlapping circuit paths on another flexible printed circuit, comprising:

clamping jaws fastened together and being urged toward one another to apply clamping forces and to clamp therebetween an overlapped stack of printed circuits, a registration portion on at least one of the clamping jaws to retain the flexible printed circuits in fixed registration with the registration portion, each of the jaws having raised clamping surfaces thereon, and each of the clamping jaws having raised pedestals, on which are the raised clamping surfaces, the raised clamping surfaces on a first of said clamping jaws directly opposing the raised clamping surfaces on a second of said clamping jaws, and the clamping surfaces concentrating clamping forces against said flexible printed circuits.

2. An interconnection mechanism as recited in claim 1 wherein, the raised clamping surfaces on each of the clamping jaws are divided into multiple segments.

3. An interconnection mechanism as recited in claim 1 wherein, the clamping surfaces extend diagonally across circuit paths on the flexible printed circuits.

4. An interconnection mechanism as recited in claim 1 wherein, the clamping surfaces extend repeatedly in reverse directions.

* * * * *